United States Patent

Sakai et al.

[11] Patent Number: 5,891,762
[45] Date of Patent: *Apr. 6, 1999

[54] METHOD OF FORMING A SEMICONDUCTOR DEVICE BY USING A CONDUCTIVE FILM AS AN ETCHING STOPPER

[75] Inventors: Hiroyuki Sakai, Uozu; Atsuhiro Kajiya, Settsu; Hisashi Ogawa, Katano, all of Japan

[73] Assignee: Matsushita Electronics Corporation, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 686,416

[22] Filed: Jul. 26, 1996

[30] Foreign Application Priority Data

Aug. 7, 1995 [JP] Japan ..................................... 7-201017

[51] Int. Cl.$^6$ ................................................ H01L 21/8242
[52] U.S. Cl. ............................ 438/132; 438/253; 438/634
[58] Field of Search ............................ 257/529; 438/132, 438/253, 601, 631, 634

[56] References Cited

U.S. PATENT DOCUMENTS

| | | | |
|---|---|---|---|
| 4,628,590 | 12/1986 | Udo et al. | 438/132 |
| 5,578,861 | 11/1996 | Kinoshita et al. | 257/529 |
| 5,618,750 | 4/1997 | Fukuhara et al. | 438/601 |

FOREIGN PATENT DOCUMENTS

| | | |
|---|---|---|
| 6452243 | 3/1989 | Japan . |
| 1169943 | 5/1989 | Japan . |
| 485948 | 3/1992 | Japan . |

*Primary Examiner*—Chandra Chaudhari
*Attorney, Agent, or Firm*—Stevens, Davis, Miller & Mosher, L.L.P.

[57] ABSTRACT

A manufacturing method for a semiconductor device, whereby poly-silicon serving as an etching stopper is formed above a redundant fuse at the same time as a cell plate is. A silicon nitride film, an oxide film, and another oxide film on the redundant fuse are consecutively etched using the poly-silicon as the etching stopper. Then the poly-silicon is etched.

4 Claims, 3 Drawing Sheets

METHOD OF FORMING A SEMICONDUCTOR DEVICE BY USING A CONDUCTIVE FILM AS AN ETCHING STOPPER

BACKGROUND OF THE INVENTION

1. Field of the Invention

The present invention relates to a semiconductor device such as a dynamic random access memory (DRAM) and a manufacturing method for the same.

2. Description of the Related Art

In recent years, the density and speed of semiconductor devices have become increasingly greater and the manufacturing process for DRAMs has accordingly required more steps and become more complicated, making the manufacture of DRAMs difficult. With this increasing trend toward higher density and higher speed, it has become extremely important to accomplish an easy manufacturing method for producing inexpensive devices with high yield.

FIG. 5 shows an example of a conventional DRAM. The DRAM shown in FIG. 5 has a p-type semiconductor substrate 1, an oxide film for a device isolation 2, which has been formed by local oxidation of silicon (LOCOS), a gate oxide film 3, a gate electrode 4 composed of poly-silicon (polycrystalline silicon), and an oxide film 5 formed by chemical vapor deposition (CVD).

A source 6a and a drain 6b of a MOS transistor of a memory cell are both composed of an n-type semiconductor region. There are also provided an oxide film 7, which has been produced as a side wall film by the CVD, a bit line 8a of the memory cell, and a redundant fuse 8b for relieving a defective memory cell, both 8a and 8b being comprised of a conductive film made of tungsten (W) polycide.

The DRAM further includes an oxide film 9 formed using CVD, a poly-silicon 10 which has been formed using low pressure CVD and which provides a storage node, and a poly-silicon 11 which has been formed using low pressure CVD and which provides a cell plate. An ONO film serving as a capacitance insulating film of a capacitor is provided between the storage node 10 and the cell plate 11 although it is not shown in FIG. 5.

Further included in the DRAM are an oxide film 12 produced using CVD, an aluminum (hereinafter referred to as "Al") electrode wiring 13 of the first layer, an oxide film 14 formed using the spin-on-glass (SOG) process or the etchback process or the like, an Al electrode wiring 15 of the second layer, a silicon nitride film 16 formed as a protective film by using plasma CVD, and a cavity 17 formed above the redundant fuse 8b.

In the conventional DRAM, as illustrated in FIG. 5, a conductive film formed using the W polycide has been used as the redundant fuse 8b for relieving a defective memory cell. An extremely thick multilayer insulating film composed of the films 9, 12, 14, and 16 is formed on the redundant fuse 8b. To make the redundancy relief easier, it has been required to etch a major part of the insulating films 12, 14, and 16 and leave only insulating film 9 of approximately 200 to 400 nm on the redundant fuse 8b in a final step. This has been required to allow a defective memory cell to be replaced with a nondefective memory cell by cutting off the redundant fuse 8b.

For this reason, it has been important to form on the redundant fuse 8b the insulating film, namely, the oxide film 9, which is thin but is not so thin that the W polycide is exposed, so as to permit easy disconnection of the redundant fuse 8b. Since the multilayer composed of the different types of insulating films, namely, 9, 12, 14, and 16, is formed on the redundant fuse 8b, it has been extremely difficult to stably etch these insulating films 9, 12, 14, and 16 with good control. Accordingly, the redundancy relief yield has also been low.

SUMMARY OF THE INVENTION

The present invention has been made with a view toward solving the problems described above and it is an object of the present invention to provide a semiconductor device and a manufacturing method for the same which enable good film thickness control of the insulating films formed on a redundant fuse, good uniformity, considerably easier manufacture, and a higher yield of redundancy relief without adding to the number of steps of the conventional manufacturing process.

To this end, according to the invention, there is provided a semiconductor device wherein a memory cell and a first insulating film are formed on a semiconductor substrate, a redundant fuse for relieving a defective memory cell is formed on the first insulating film, a second insulating film is formed to cover the redundant fuse, and a third insulating film is formed on the second insulating film. The third insulating film has a cavity right above the redundant fuse, which cavity is wider than the redundant fuse and which is as high as the surface of the second insulating film. A conductor is left annularly along the inner periphery of the bottom of the cavity of the third insulating film.

With this arrangement, the annular conductor left along the inner periphery of the bottom of the cavity of the third insulating film serves as an etching stopper when etching the third insulating film to enable complete or accurate removal of the third insulating film. This makes it possible to achieve good controllability of the thickness of the insulating films on the redundant fuse, good uniformity, and extremely easy manufacturing process, with resultant improved redundancy relief yield.

Moreover, according to the manufacturing method of the semiconductor device, the following process will be implemented at the same time as the memory cell is formed on the semiconductor substrate: First, the first insulating film is formed on the semiconductor substrate. Second, the redundant fuse for relieving a defective memory cell is formed on the first insulating film at the same time as the bit line on the source of the transistor in the memory cell is formed and by using the same material as that used for the bit line. Third, the second insulating film is formed to cover the redundant fuse. Fourth, a conductor which is wider than the redundant fuse is formed right above the redundant fuse on the second insulating film at the same time as the cell plate in the memory cell is formed and by using the same material as that used for the cell plate. Fifth, the third insulating film covering the conductor is formed. Sixth, a cavity pattern which is narrower than the conductor but wider than the redundant fuse is formed right above the redundant fuse of the third insulating film by using photoresist. Seventh, the third insulating film is etched until the conductor is exposed by using the photoresist as the mask, thereby providing the third insulating film with a cavity which corresponds to the cavity pattern; and lastly, the conductor is etched through the cavity to expose the second insulating film.

According to this method, using the conductor as the etching stopper when etching the third insulating film enables only the third insulating film on the redundant fuse to be completely removed. After that, the conductor is removed to leave the second insulating film on the redundant fuse. Thus, the method in accordance with the invention permits good control of the thickness of the insulating films on the redundant fuse, good uniformity, markedly easier manufacture, higher redundancy relief yield, and significantly higher yield of the semiconductor devices. Furthermore, the conductor is made at the same time as the cell plate in the memory cell is formed and by using the same material as that used for the cell plate; therefore, it does not add to the number of process steps of the conventional manufacture of semiconductor devices.

DESCRIPTION OF THE PREFERRED EMBODIMENT

Figure 1:
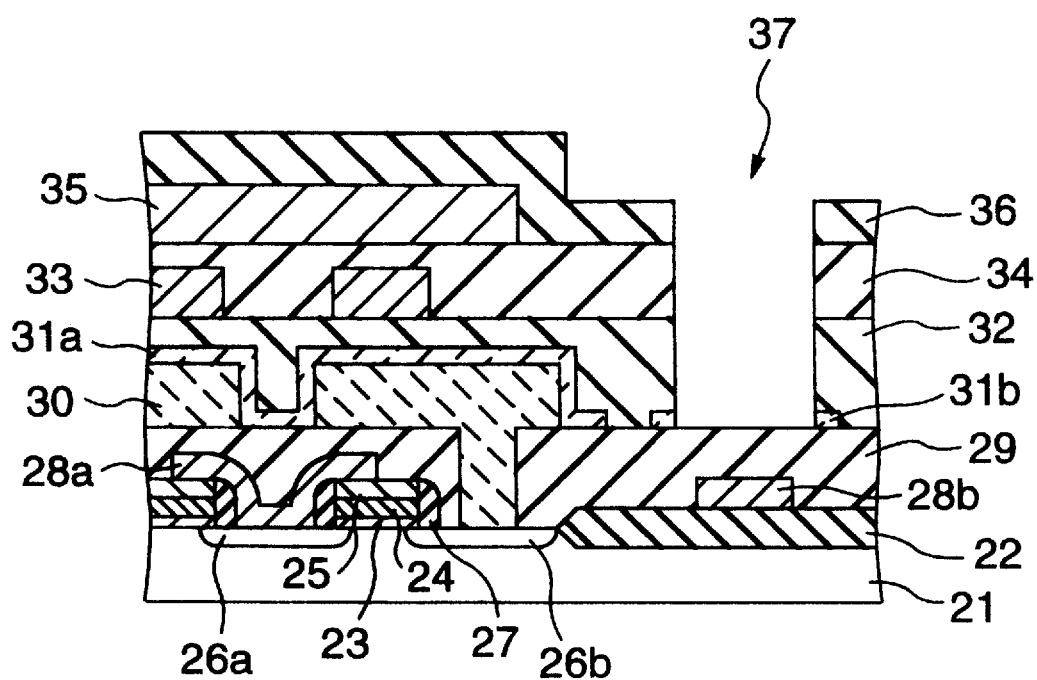
FIG. 1 is a sectional view showing an essential section of the configuration of a DRAM of an embodiment in accordance with the present invention.

FIG. 1 is a sectional view showing an essential section of an embodiment wherein a semiconductor device according to the present invention has been applied to a DRAM. The DRAM shown in FIG. 1 includes a p-type (100) semiconductor substrate 21, an oxide film for device isolation 22 formed by LOCOS which corresponds to the first insulating film in the attached claims, a gate oxide film 23, a gate electrode 24 composed of poly-silicon, and an oxide film 25 formed using CVD.

A source 26a and a drain 26b of a MOS transistor of a memory cell are both composed of an n-type semiconductor region. There are also provided an oxide film 27 which has been produced as a side wall film by CVD, a bit line 28a of the memory cell, and a redundant fuse 28b for relieving a defective memory cell, both 28a and 28b being comprised of a conductive film made of the W polycide.

The DRAM further includes an oxide film 29 which corresponds to the second insulating film in the attached claims and which has been formed using CVD to cover the bit line 28a and the redundant fuse 28b, a storage node 30 composed of poly-silicon which has been formed using low pressure CVD, a cell plate 31a, and a conductor 31b serving as the etching stopper on the redundant fuse 28b, both 31a and 31b being composed of poly-silicon which has been formed using low pressure CVD. The present invention is characterized in that the conductor 31b composed of the poly-silicon is formed also on the redundant fuse 28b at the same time the cell plate 31a of the memory cell is formed and by using the same material as that used for forming the cell plate 31a. An ONO film serving as a capacitance insulating film of a capacitor is provided between the storage node 30 and the cell plate 31a although it is not shown in FIG. 1.

Further included in the DRAM are an oxide film 32 which has been produced using CVD and which corresponds to the third insulating film in the attached claims, an Al electrode wiring 33 of the first layer, an oxide film 34 which has been formed using the SOG process or the etchback process or the like and which corresponds to the third insulating film in the attached claims, an Al electrode wiring 35 of the second layer, and a silicon nitride film 36 which has been formed as a protective film by using plasma CVD and which corresponds to the third insulating film in the attached claims.

A cavity 37 formed right above the redundant fuse 28b is made wider than the redundant fuse 28b and extends as high as the surface of the oxide film 29. The cavity 37 is formed by etching the silicon nitride film 36, the oxide film 34, and the oxide film 32 at a time by using the conductor 31b composed of poly-silicon as the etching stopper. The combination of insulating films and poly-silicon increases an etch rate ratio of the above materials to meet etching requirements; therefore, even when an extended overetching time is set, the etching of the insulating films 36, 34, and 32 is completely stopped at the conductor 31b. Then, the conductor 31b is etched. In this way, the etching of the extremely thick insulating film comprising 36, 34, and 32 is completely stopped at the conductor 31b, making it possible to leave the oxide film 29 on the redundant fuse 28b by the formed film thickness with extremely accurate control.

Thus, the present invention permits extremely good controllability for etching a very thick multilayer insulating film composed of 36, 34, and 32, good uniformity, and considerably easier manufacture without adding to the number of process steps of the conventional manufacture of DRAMs. This enables a higher yield of redundancy relief of memory cells and a markedly higher yield of DRAMs.

Figure 2:
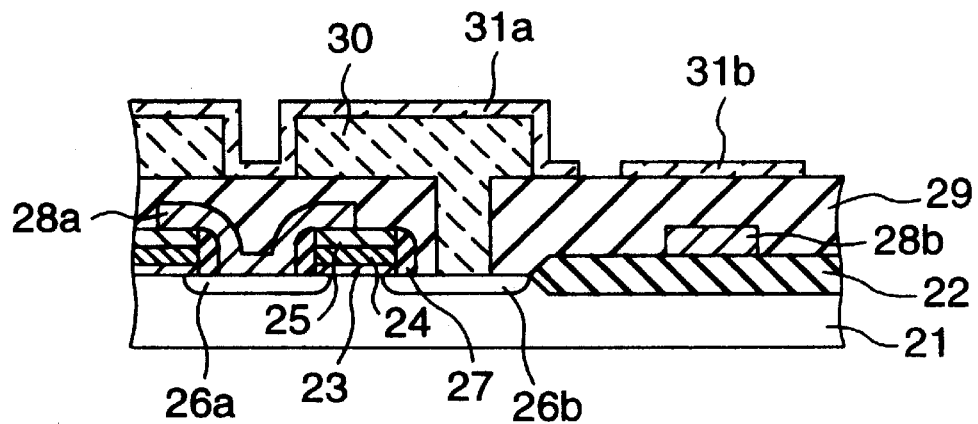
FIG. 2 is a sectional view illustrating a first process step of the manufacturing method of the DRAM of the embodiment in accordance with the present invention.
Figure 3:
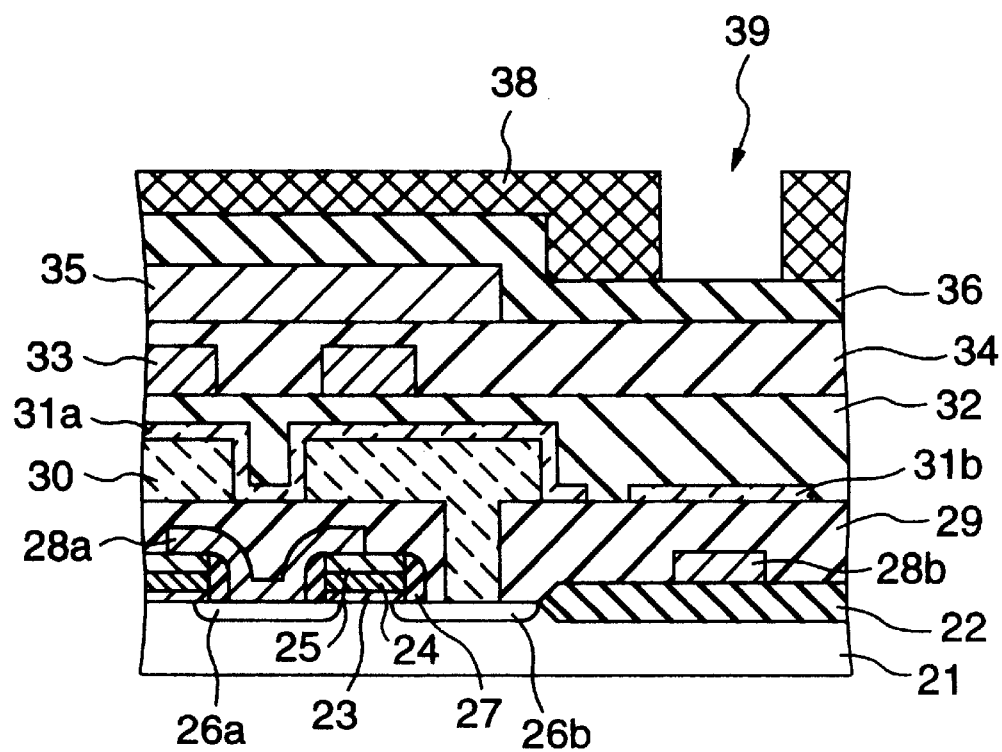
FIG. 3 is a sectional view illustrating a second process step of the manufacturing method of the DRAM of the embodiment in accordance with the present invention.
Figure 4:
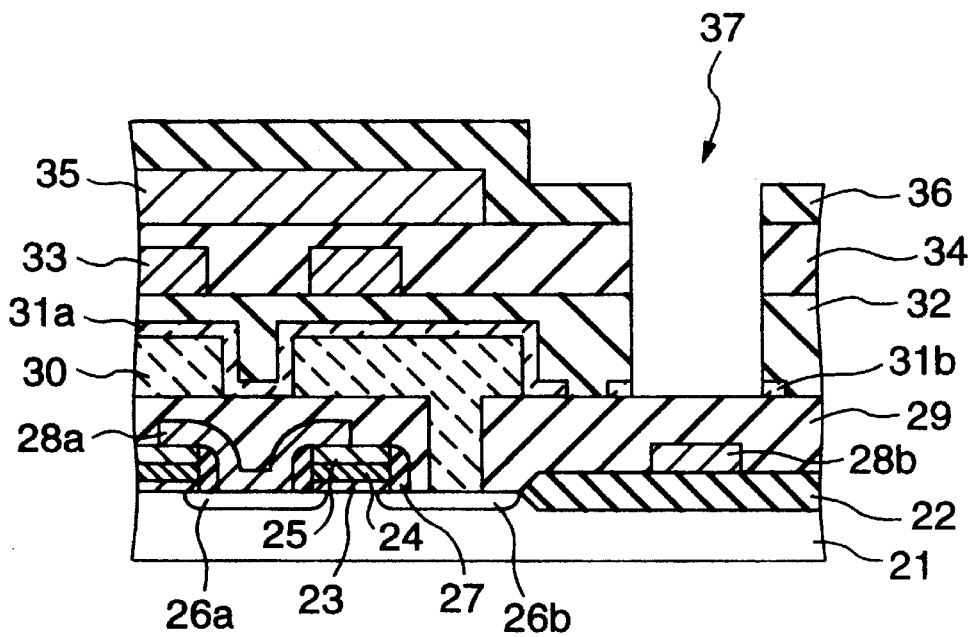
FIG. 4 is a sectional view illustrating a third process step of the manufacturing method of the DRAM of the embodiment in accordance with the present invention.
Figure 5:
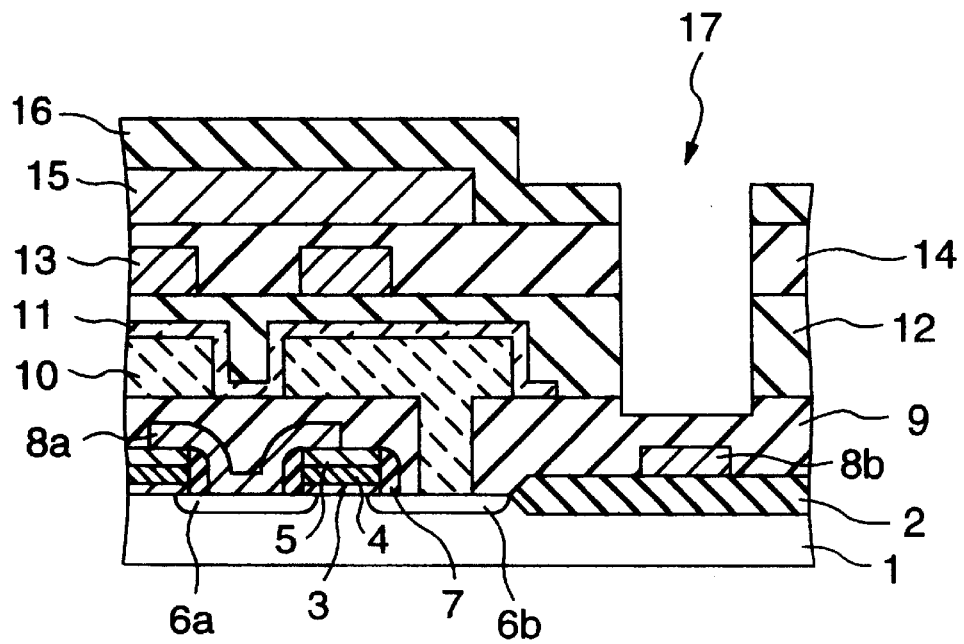
FIG. 5 is a sectional view showing an essential section of the configuration of a conventional DRAM.

Referring now to FIG. 2 through FIG. 4, an embodiment to which the manufacturing method of semiconductor devices in accordance with this invention has been applied for manufacturing DRAMs will be described. The manufacturing method shows the method for manufacturing the DRAM shown in FIG. 1.

Shown in FIG. 2 are the p-type (100) semiconductor substrate 21, the 350-nm oxide film for device isolation 22 formed using the LOCOS process, the 12-nm gate oxide film 23, the 250-nm gate electrode 24 composed of poly-silicon, and the 280-nm oxide film 25 formed by the low pressure CVD. The source 26a and the drain 26b of the MOS transistor of the memory cell are both composed of an n-type semiconductor region formed using the ion implantation. There are also shown the 140-nm oxide film 27 which has been produced as the side wall film by the low-pressure CVD, the bit line 28a of the memory cell, and the redundant fuse 28b for relieving a defective memory cell, both 28a and 28b being comprised of a 300 nm conductive film made of the W polycide.

The oxide film 29 is an insulating film produced by flowing a boro-phospho-silicate-glass (BPSG) film, which has been formed using the atmospheric CVD, through heat treatment at 850 degrees centigrade and smoothing it; the oxide film 29 is formed to 300 nm on the redundant fuse 28b. The storage node 30 is composed of a 500-nm poly-silicon which has been formed on the drain of the memory cell by using the low pressure CVD.

The cell plate 31a of the memory cell and the conductor 31b serving as the etching stopper on the redundant fuse 28b are both composed of a 150-nm poly-silicon which has been formed using low pressure CVD. The present invention is characterized in that the conductor 31b serving as the etching stopper is formed also on the redundant fuse 28b by using the same material and in the same process step as those for forming the cell plate 31a of the memory cell; the conductor 31b is made wider than the redundant fuse 28b right above the redundant fuse 28b. The ONO film serving as a capacitance insulating film of a capacitor is provided between the storage node 30 and the cell plate 31a although it is not shown in FIG. 2.

In FIG. 3, the oxide film 32 is produced by flowing a BPSG film, which has been formed using atmospheric CVD, through heat treatment at 850 degrees centigrade and smoothing it; the oxide film 32 is formed to 800 nm on the conductor 31b of the redundant fuse. The Al electrode wiring 33 of the first layer is formed to 700 nm. The flat oxide film 34 has been formed using the SOG process or the etchback process or the like; it is formed to 1400 nm on the oxide film 32.

The Al electrode wiring 35 of the second layer is formed to 700 nm. The silicon nitride film 36, which has been produced as protective film by the plasma CVD, is formed to 1000 nm. A photoresist film 38 has a cavity pattern 39 above the redundant fuse 28b, the cavity pattern 39 being narrower than the conductor 31b. At this time, formed on the conductor 31b of the redundant fuse 28b is an insulating film of a total of 3200 nm composed of the 1000-nm silicon nitride film 36, the 1400-nm oxide film 34, and the 800-nm oxide film 32.

In FIG. 4, the silicon nitride film 36, the oxide film 34, and the oxide film 32 are etched in succession to form the cavity 37 by using the cavity pattern 39 of the photoresist film 38 as the mask. Since the etching is performed using the conductor 31b as the etching stopper, the silicon nitride film 36, the oxide film 34, and the oxide film 32 can be fully etched. The combination of insulating films and poly-silicon increased etch rate ratio of those materials to meet etching requirements; therefore, even when an extended overetching time is set for the insulating films, the etching of the insulating films 36, 34, and 32 is completely stopped at the conductor 31b. Then, the conductor 31b is etched. In this way, the etching of the extremely thick 3200-nm insulating film comprising 36, 34, and 32 is completely stopped at the conductor 31b composed of poly-silicon, making it possible to uniformly leave the oxide film 29 on the redundant fuse 28b by about 300 nm with extremely accurate control.

Thus, according to this embodiment, in the DRAM manufacturing process, the conductor 31b is formed above the redundant fuse 28b at the same time as the cell plate 31a is formed, and the conductor 31b serves as the etching stopper when etching the oxide films on the redundant fuse 28b. This permits extremely good film thickness controllability and uniformity and also enables considerably easier manufacture without the need to add to the number of process steps of the conventional manufacture of DRAMs. As a result, a higher yield of redundancy relief of memory cells and a markedly higher yield of DRAMs can be achieved.

In the embodiment described above, the conductor serving as the etching stopper has been formed using the same material as that of the cell plate at the same time as the cell plate; however, the conductor may alternatively be formed using the same material as that used for the storage node.

What is claimed is:

1. A method of manufacturing a semiconductor device having a memory cell and a redundant fuse for relieving a defective memory cell, said method comprising:

(a) forming said redundant fuse from a first conductive film on a first insulating film formed on a semiconductor substrate while simultaneously forming a bit line from a second conductive film on a source of a transistor in said memory cell;

(b) forming a second insulating film to cover said redundant fuse and said memory cell;

(c) forming a storage node on said second insulating film said storage node being connected to a drain of said transistor in said memory cell;

(d) forming a capacitance insulating film on said storage node;

(e) forming an etching stopper, comprising a conductor which is wider than said redundant fuse, right above said redundant fuse on said second insulating film while simultaneously forming a cell plate made of said conductor on said memory cell so as to cover at least said capacitance insulating film;

(f) forming a third insulating film covering said cell plate and said etching stopper;

(g) forming a cavity pattern of photoresist, said cavity pattern being narrower than said etching stopper but wider than said redundant fuse, on a portion of said third insulating film which is right above said redundant fuse;

(h) etching said third insulating film until said etching stopper is exposed by using said photoresist as a mask so as to provide said third insulating film with a cavity; and (i) etching said etching stopper through said cavity to expose said second insulating film.

2. A method according to claim 1, wherein said conductor comprises poly-silicon.

3. A method according to claim 1, wherein, in step (a), said first conductive film and said second conductive film are formed of a common material.

4. A method according to claim 3, wherein said common material comprises W polycide.

* * * * *